(12) United States Patent
Furukawa

(10) Patent No.: US 6,498,998 B1
(45) Date of Patent: Dec. 24, 2002

(54) METHOD AND APPARATUS FOR TESTING A SEMICONDUCTOR DEVICE

(75) Inventor: Yasuo Furukawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 292 days.

(21) Appl. No.: 09/591,620

(22) Filed: Jun. 9, 2000

(30) Foreign Application Priority Data

Jun. 9, 1999 (JP) ............................................. 11-163142
May 16, 2000 (JP) ....................................... 2000-144022

(51) Int. Cl.[7] ............................................. G01R 31/14
(52) U.S. Cl. ........................ 702/117; 702/124; 341/120
(58) Field of Search ........................ 702/57–59, 64–66, 702/69–74, 81–84, 108, 116, 117, 119–121, 124–126, 182, 183, 185, 186; 324/76.12, 76.15, 76.38, 76.52, 76.58; 341/120, 118

(56) References Cited

U.S. PATENT DOCUMENTS

| | | | | |
|---|---|---|---|---|
| 3,745,561 A | * | 7/1973 | Van Dijk et al. | 341/110 |
| 4,667,296 A | * | 5/1987 | Crowe | 341/118 |
| 5,063,383 A | * | 11/1991 | Bobba | 324/73.1 |
| 5,185,607 A | * | 2/1993 | Lyon et al. | 324/73.1 |
| 5,659,312 A | * | 8/1997 | Sunter et al. | 341/120 |
| 6,326,909 B1 | * | 12/2001 | Yamaguchi | 341/120 |
| 2001/0019313 A1 | * | 9/2001 | Takahashi et al. | 341/147 |
| 2002/0005794 A1 | * | 1/2002 | Yamaguchi | 341/120 |

FOREIGN PATENT DOCUMENTS

SU          1596270       *  9/1990

* cited by examiner

Primary Examiner—Marc S. Hoff
Assistant Examiner—Manuel L. Barbee
(74) Attorney, Agent, or Firm—Rosenthal & Osha L.L.P.

(57) ABSTRACT

Method and apparatus for testing a semiconductor device having an A-D converting unit, capable of generating a highly accurate test waveform of high speed. The semiconductor testing apparatus includes: a first waveform generating unit which generates a first waveform having a predetermined waveform component; a second waveform generating unit which generates a second waveform having a known waveform component; a waveform synthesizing unit which generates a composite waveform by synthesizing the first waveform and the second waveform; a processing unit which processes to remove an effect of the second waveform from an output value; and a comparator which judges based on the first waveform and the output value processed by the processing unit.

21 Claims, 12 Drawing Sheets

METHOD AND APPARATUS FOR TESTING A SEMICONDUCTOR DEVICE

This patent application claims priority based on a Japanese patent application, H11-163142 filed on Jun. 9, 1999 and 2000-144022 filed on May 16, 2000, the contents of which are incorporated herein by reference.

BACKGROUND OF THE INVENTION

1. Field of the Invention

The present invention relates to semiconductor testing apparatus which tests an A-D converting device that converts an analog signal to a digital signal. More particularly, the present invention relates to a waveform generating unit which generates a test waveform that is to be input to the A-D converting device under test.

2. Description of the Related Art

Accompanied by the improvement of semiconductor technology, the performance of the A-D converting device has been significantly improved. For example, the A-D converting device for use with a digital TV can process a signal of 8 MHz level. The A-D converting device for use with a hard disk can process a signal of some hundred MHz. Accompanied by the performance improvement of the A-D converting device, the same degree of improvement in performance of the semiconductor testing apparatus is required.

FIG. 1 shows a block diagram of the conventional semiconductor testing apparatus 100. The semiconductor testing apparatus 100 is comprised of a waveform generator 10, a sampling clock generator 12, a device contact portion 14 and a comparator 16. An A-D converting device 90 under test is placed on the device contact portion 14. The waveform generator 10 generates a test waveform which is to be input to the A-D converting device 90 under test, so as to be output to the device contact portion 14. Moreover, the A-D converting device 90 under test to which the test waveform is input outputs an expectation value to the comparator 16.

The sampling clock generator 12 outputs to the device contact portion 14 a sampling clock which specifies a sampling interval. The A-D converting device 90 under test samples the test waveform supplied via the device contact portion 14, at the timing of the sampling clock, so that a sampled value or an output value is output to the comparator 16. The comparator 16 compares the output value with the expectation value supplied from the waveform generator 10, and judges whether or not the A-D converting device 90 under test operates normally.

In order to test the A-D converting device, required is that a test signal equivalent to a signal that the A-D converting device actually processes be input to the A-D converting device. Thus, the semiconductor testing apparatus needs to have a waveform generator which generates the test waveform accurately and at high speed. For example, the waveform generator generates a sinusoidal wave as the test waveform. The performance required for the waveform generator is such that the frequency characteristic be twice as much and the dynamic range be greater than 20 dB relative to the device under test. However, generating such a highly accurate test waveform of high speed is extremely difficult in practice.

SUMMARY OF THE INVENTION

Therefore, it is an object of the present invention to provide method and apparatus for testing a semiconductor device which overcome the above issues in the related art. This object is achieved by combinations described in the independent claims. The dependent claims define further advantageous and exemplary combinations of the present invention.

According to an aspect of the present invention, semiconductor testing apparatus for testing a semiconductor device having an A-D converting, comprises: a first waveform generating unit which generates a first waveform having a predetermined waveform component; a second waveform generating unit which generates a second waveform having a known waveform component; a wave form synthesizing unit which generates a composite (synthesized) waveform by synthesizing the first waveform and the second waveform; a processing unit which processes to remove an effect of the second waveform from an output value of the semiconductor device to which the composite waveform is input; and a comparator which judges whether or not the semiconductor device operates normally, based on the first waveform and the output value processed by said processing unit.

Preferably, the comparator judges whether or not the semiconductor device operates normally based on whether or not difference between the first waveform and the output value processed by the processing unit is within a predetermined range.

Moreover, the second waveform generating unit may generate the second waveform based on a sampling clock which sets a sampling interval of the A-D converting unit. Moreover, the second waveform generating unit generates the second waveform by frequency-dividing the sampling clock.

The semiconductor testing apparatus may further comprise a phase shift unit that shifts a phase of the second waveform by a predetermined amount.

Moreover, the semiconductor testing apparatus may further comprise a pulse width adjusting unit that changes a pulse width of the second waveform, where the second waveform is preferably a square or rectangular wave.

Suppose that the first waveform is a sinusoidal wave. The semiconductor testing apparatus may further comprise an amplitude control unit which sets an amplitude of the sinusoidal wave.

Moreover, the processing unit reduces the effect of the second waveform by performing a filtering process on the output value.

Moreover, the semiconductor testing apparatus may further comprise a plurality of the second waveform generating units, in which the waveform synthesizing unit generates the composite waveform by synthesizing the first waveform and a plurality of the second waveforms generated by a plurality of the second waveform generating units.

According to another aspect of the present invention a method of testing a semiconductor device having an A-D converting unit therein comprises: generating a synthesized waveform by a first waveform having a predetermined waveform component and a second waveform whose waveform component is known; inputting the synthesized waveform to the semiconductor device; removing an effect of the second waveform from an output value of the semiconductor device; and judging whether or not the semiconductor device operates normally, based on the first waveform and the output value in which the effect of the second waveform is removed.

The judging step preferably judges whether or not the semiconductor device operates normally based on whether or not difference between the first waveform and the output value in which the effect of the second waveform is removed.

According to still another aspect of the present invention, a semiconductor device having a semiconductor testing unit which tests a device portion including an A-D converting unit, comprises: a waveform synthesizing unit which synthesizes a first waveform having a predetermined waveform component and a second waveform whose waveform component is known, so as to generate a synthesis waveform; the semiconductor testing unit which tests the device portion, based on an output value of the device portion to which the synthesis waveform is input; and the device portion which is tested by the semiconductor testing unit.

The semiconductor testing unit may further comprise a first waveform generating unit which generates the first waveform. Moreover, the semiconductor testing unit may further comprise: a processing unit which processes to remove an effect of the second waveform from the output value of the device portion to which the synthesis waveform is input; and a comparator which judges whether or not the device portion operates normally, based on the first waveform and the output value processed by the processing unit.

Preferably, the second waveform is generated based on a sampling clock which sets a sampling interval of the A-D converting unit.

Preferably, the second waveform is obtained by frequency-dividing the sampling clock.

The semiconductor device may further comprise a phase shift unit which shifts a phase of the second waveform by a predetermined amount.

Moreover, the semiconductor device may further comprise a pulse width adjusting unit that changes a pulse width of the second waveform, where the second waveform is a square or rectangular wave.

Suppose that the first waveform is a sinusoidal wave. The semiconductor device may further comprise an amplitude control unit which sets an amplitude of the sinusoidal wave.

Moreover, the processing unit reduces the effect of the second waveform by performing a filtering process on the output value.

This summary of the invention does not necessarily describe all necessary features of the present invention. The present invention may also be a sub-combination of the above described features. The above and other features and advantages of the present invention will become more apparent from the following description of embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
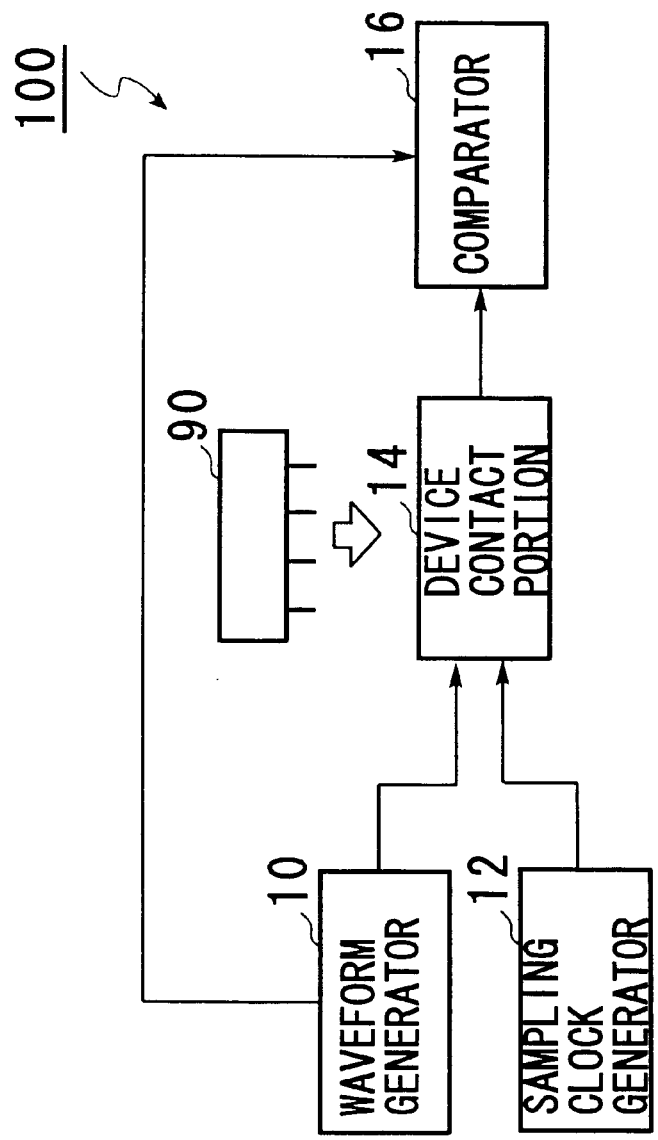
FIG. 1 shows a block diagram of the conventional semiconductor testing apparatus 100.
Figure 2:
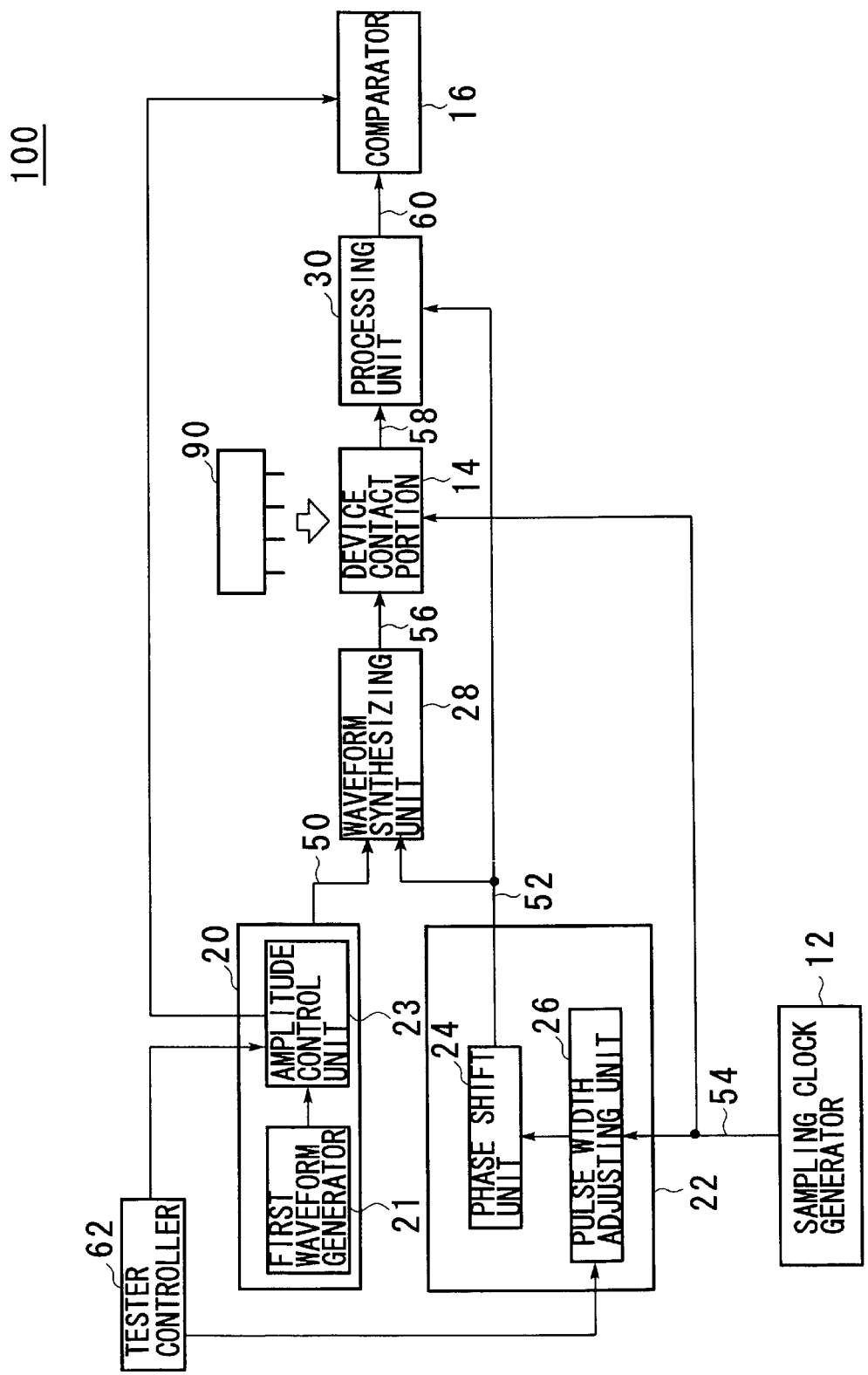
FIG. 2 is a block diagram showing an embodiment of a semiconductor testing apparatus 100.

FIG. 2 is a block diagram showing an embodiment of a semiconductor testing apparatus 100. The semiconductor testing apparatus 100 comprises: a first waveform generating unit 20; a second waveform generating unit 22; a waveform synthesizing unit 28; a device contact portion 14; a processing unit 30, a comparator 16; a sampling clock generator 12; and a tester controller 62. The first waveform generating unit 20 comprises a first waveform generator 21 and an amplitude control unit 23. The second waveform generating unit 22 comprises a pulse width adjusting unit 26 and a phase shift unit 24. An A-D converting device 90 under test is placed on the device contact portion 14. For example, the device contact portion 14 may be a socket which electrically connects input and output terminals of the A-D converting device 90 under test.

The first waveform generator 21 generates a test waveform which is to be input to the A-D converting device under test so as to be output to the amplitude control unit 23. For example, the first waveform generator 21 may generate a sinusoidal waveform as the test waveform. The amplitude control unit 23 controls an amplitude of the test waveform supplied from the first waveform generator 21, based on an amplitude control signal supplied from the tester controller 62, so that a first waveform 50 corresponding to a characteristic of the A-D converting device 90 under test is output to the waveform synthesizing unit 28. For example, the amplitude control unit 23 may set an amplitude of the test waveform, based on an input range within the range of a voltage level of the analog signal that the A-D converting device 90 under test can convert into the digital signal.

For example, when the input range of the A-D converting device 90 under test is within ±1.0 V, the amplitude control unit 23 sets the amplitude of the test waveform at ±1.0 V. Moreover, the amplitude control unit 23 outputs to the comparator 16 an expectation value that is the first waveform 50. According to another embodiment, the first waveform generating unit 20 includes an A-D converting unit, so that the first waveform 50 which now has been digitized by the A-D converting unit may be output to the comparator 16 as the expectation value. The sampling clock generator 12 outputs to the pulse width adjusting unit 26 and the device contact portion 14 a sampling clock 54 which sets a sampling interval. The pulse width adjusting unit 26 included in the second waveform generating unit 22 adjusts the pulse width of the sampling clock 54, based on the pulse width adjusting signal supplied from the tester controller 62. The pulse width adjusting unit 26 outputs to the phase shift unit 24 the pulse width adjusted sampling clock 54.

For example, when a pulse width adjusting signal which specifies the pulse width to widen is supplied, the pulse width adjusting unit 26 widens the pulse width of the sampling clock 54. When a pulse width adjusting signal which specifies the pulse width to narrow is supplied, the pulse width adjusting unit 26 narrows the pulse width of the sampling clock 54. Moreover, when a pulse width adjusting signal which specifies the pulse width not to change, the pulse width adjusting unit 26 does not change the pulse width of the sampling clock 54. According to still another embodiment, the pulse width adjusting unit 26 is not provided. According to still another embodiment, a PLL (phase locked loop) which generates a clock having a predetermined period may serve as the second waveform generating unit 22.

The phase shift unit 24 shifts a phase of the sampling clock 54 supplied from the pulse width adjusting unit 26, by a predetermined amount, so as to output the second waveform 52 to the waveform synthesizing unit 28 and the processing unit 30. In the second waveform generating unit 22, plural types of the second waveforms 52 can be generated by the phase shift unit 24 and the pulse width adjusting unit 26. The waveform synthesizing unit 28 synthesizes the first waveform 50 and the second waveform 52 so as to output a synthesized (composite) waveform to the device contact portion 14. For example, the waveform synthesizing unit 28 may be an adder which adds up the first waveform 50 and the second waveform 52. According to still another embodiment, the waveform synthesizing unit 28 may be a multiplier which multiplies the first waveform 50 to the second waveform 52. According to still another embodiment, the waveform synthesizing unit 28 may be a subtracter which subtracts the second waveform 52 from the first waveform 50. As a still another embodiment, the semiconductor testing apparatus 100 comprises a plurality of the second waveform generating units 22, so that the waveform synthesizing unit 28 synthesizes a plurality of the second waveforms 52 supplied from a plurality of the second waveform generating units 22 so as to output the synthesized waveform 56 to the device contact portion 14.

The A-D converting device 90 under test samples the synthesized waveform 56 via the device contact portion 14, at the timing of the sampling clock 54 supplied via the device contact portion 14. The A-D converting device 90 under test outputs an output value 58 that is a sampled value obtained by sampling the synthesized waveform 56, to the processing unit 30 via the device contact portion 14.

The processing unit 30 performs a process by which to remove the effect of the second waveform 52 from the output value 58, so as to output the processed signal 60 to the comparator 16. For example, the processing unit 30 may perform a filtering process which removes a particular frequency from the output value 58, and the processing unit 30 may perform a filtering process which removes a frequency of the second waveform 52 from the output value 58.

The comparator 16 compares the processed signal 60 with the expectation value that is the first waveform supplied from the first waveform generating unit 20, so as to judge whether or not the A-D converting device 90 under test is defective, that is, whether or not the device 90 operates normally. For example, the comparator 16 may compare. or specifically detect the displacement between the processed signal 60 and the expectation value, so that whether or not the A-D converting device 90 under test operates normally is judged based on whether or not the displacement lies within a predetermined range. For example, in a case of a high-precision A-D converting device under test, the predetermined range is set to approximately 0. Moreover, the predetermined range is preferably set according to the A-D converting device 90.

Moreover, when the A-D converting device 90 is comprised of a structure by which to perform a predetermined process on an input signal of an amplifier or the like, besides an A-D converting unit which converts the analog signal to the digital signal, the comparator 16 judges whether or not the A-D converting device 90 under test operates normally, by preferably taking into consideration the effect due to the structure that performs the predetermined process.

Figure 3:
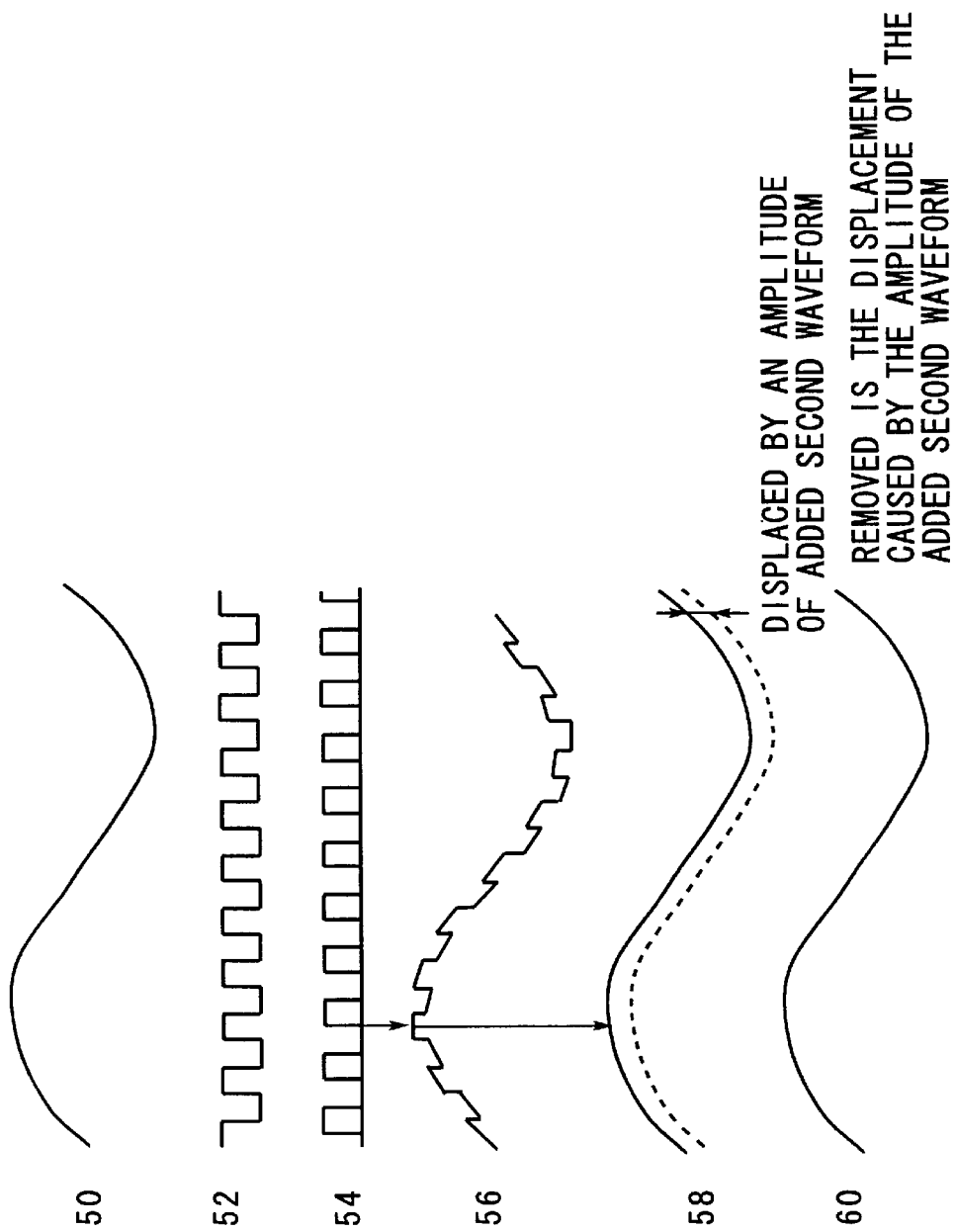
FIG. 3 is a timing chart of the semiconductor testing apparatus described with reference to FIG. 2.

FIG. 3 is a timing chart of the semiconductor testing apparatus described with reference to FIG. 2. In this timing chart, it is supposed that the first waveform generating unit 20 outputs a sinusoidal wave as the first waveform 50, the second waveform generating unit 22 outputs a square wave as the second waveform 52, and the adder serves as the waveform synthesizing unit 28.

The first waveform generating unit 20 outputs the sinusoidal wave, as the first waveform 50, corresponding to the characteristic of the A-D converting device 90 under test, to the waveform synthesizing unit 28. The second waveform generating unit 22 outputs the square wave, as the second waveform 52, in which a phase of the sampling clock 54 supplied from the sampling clock generator 12 is shifted, to the waveform synthesizing unit 28. For example, the phase shift unit 24 may shift the phase of the sampling clock 54 such that the A-D converting device 90 under test samples the synthesized waveform 56 at a position where the effect of the second waveform 52 appears (that is a convex part in the synthesized waveform in FIG. 3).

The waveform synthesizing unit 28 outputs the synthesized (composite) waveform 56 to the device contact portion 14 by adding up the first waveform 50 and the second waveform 52. The A-D converting device 90 under test samples the synthesized waveform 56 at the timing of a rising edge of the sampling clock 54. Thus, the output value 58 becomes a value where the amplitude of the second waveform 52 is added. The processing unit 30 outputs to the comparator 16 the processed signal 60 in which the amplitude of the second waveform 52 is subtracted from the output value 58. For example, when the A-D converting device 90 under test operates in the normal condition, it is preferable that a signal of which the amplitude of the second waveform 52 is removed from the output value 58 becomes the first waveform 50.

According to another embodiment, the first waveform generating unit 20 may output the square wave, triangular wave and a plurality of waveforms as the first waveform 50. Moreover, the second waveform generating unit 22 may output the known square wave, triangular wave and a plurality of waveforms as the second waveform 52. For example, when the triangular wave is output as the second waveform 52, the effect of the second waveform 52 which appears in the synthesized waveform 56 changes linearly, so that the characteristic against an input range can be judged in a linear manner if a sampling timing of the A-D converting device 90 under test is shifted.

It is obvious that a structure would be different from those of the first waveform generating unit 20 and the second waveform generating unit 22 of the semiconductor testing apparatus 100 described with reference to FIG. 2 if the first waveform generating unit 20 or the second waveform generating unit 22 produces one of the synthesized (composite) waveforms among the triangular wave, sinusoidal wave and the plural waveforms. An embodiment in which the first waveform generating unit 20 generates the sinusoidal wave and the second waveform generating unit 22 generates the square wave will only be described in this specification.

Figure 4:
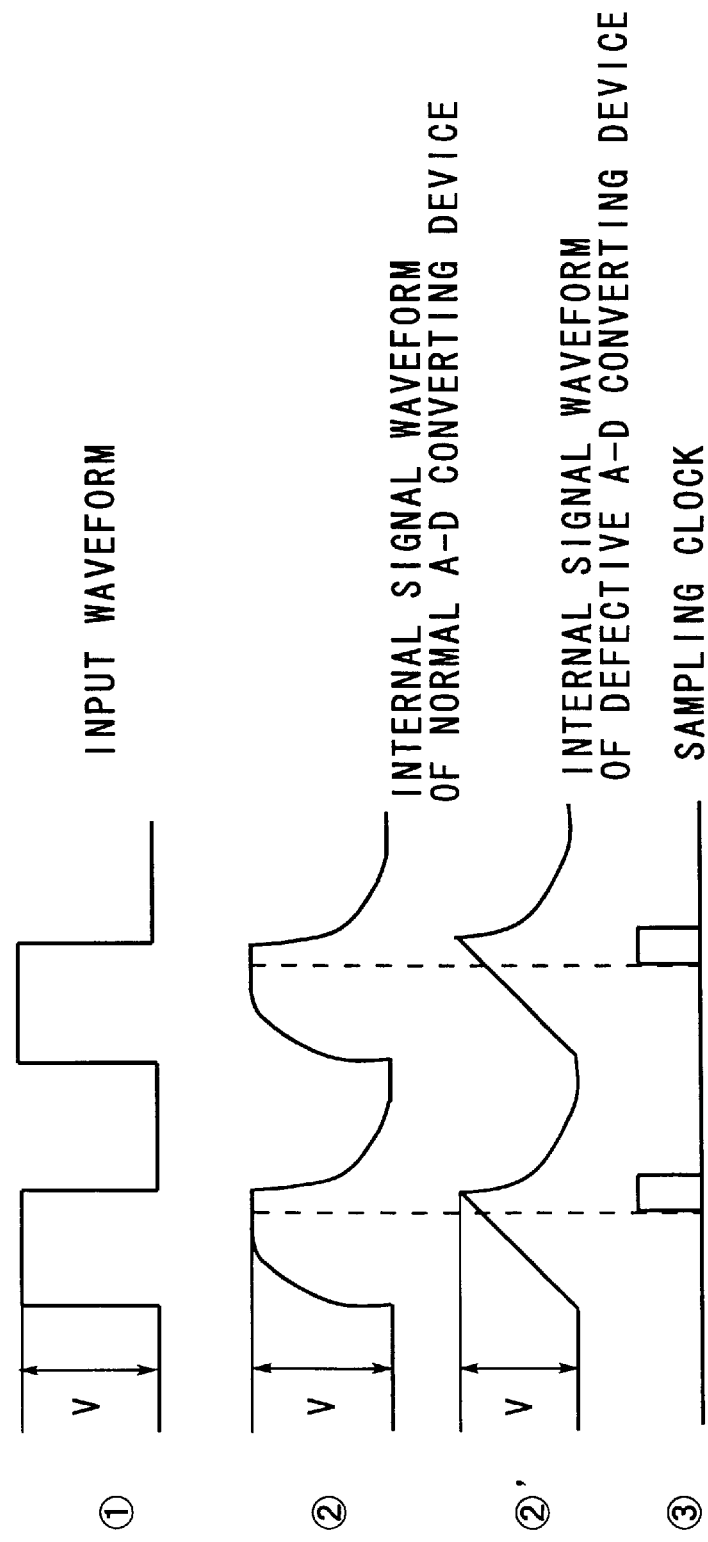
FIG. 4 shows voltage levels of a normal A-D converting device as well as a defective A-D converting device which cannot reliably sample the high-frequency wave.

FIG. 4 shows voltage levels of a normal A-D converting device as well as a defective A-D converting device which cannot reliably sample the high-frequency wave. In what to follow, suppose that the input waveform of the square wave where the voltage values "High" and "Low" are repeated at a predetermined period is supplied to the A-D converting device. In a case of a normal A-D converting device, the internal signal voltage reaches the voltage value "High" of the input waveform before the sampling timing. In a case of a defective A-D converting device, the internal signal voltage does not reach the voltage value "High" before the sampling timing.

Figure 5:
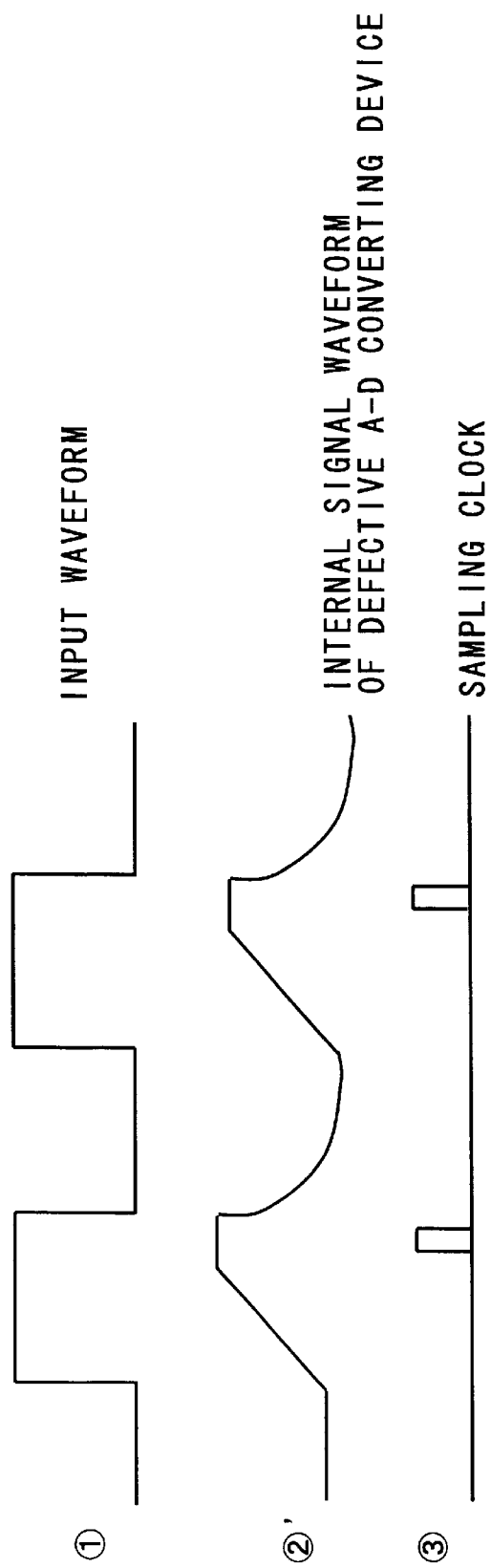
FIG. 5 shows a voltage level of the internal signal of the defective A-D converting device described with reference to FIG. 4 in a case where the frequency of the sampling clock is lowered.

FIG. 5 shows a voltage level of the internal signal of the defective A-D converting device described with reference to FIG. 4 in a case where the frequency of the sampling clock is lowered. Referring to FIG. 5, accompanied by a decrease of the sampling clock's frequency, the frequency of the input signal decreases. The internal signal voltage of the defective A-D converting device reaches the voltage value "High" of the input waveform before the sampling timing.

In the defective A-D converting device, changing the frequency of the sampling clock 54 or changing the pulse width of the input waveform changes the sample value. Utilizing such the characteristics of the A-D converting device, the frequency of the sampling clock is changed from a high-frequency state to a low-frequency state, so as to judge whether or not the A-D converting device operates normally.

Figure 6A:
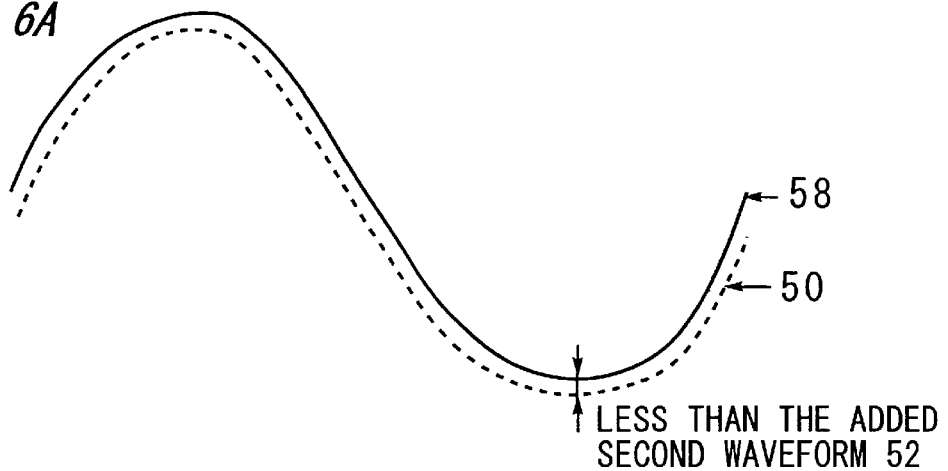
FIGS. 6A and 6B are timing charts when the A-D converting device under test is defective in the semiconductor testing apparatus described with reference to FIG. 2.
Figure 6B:
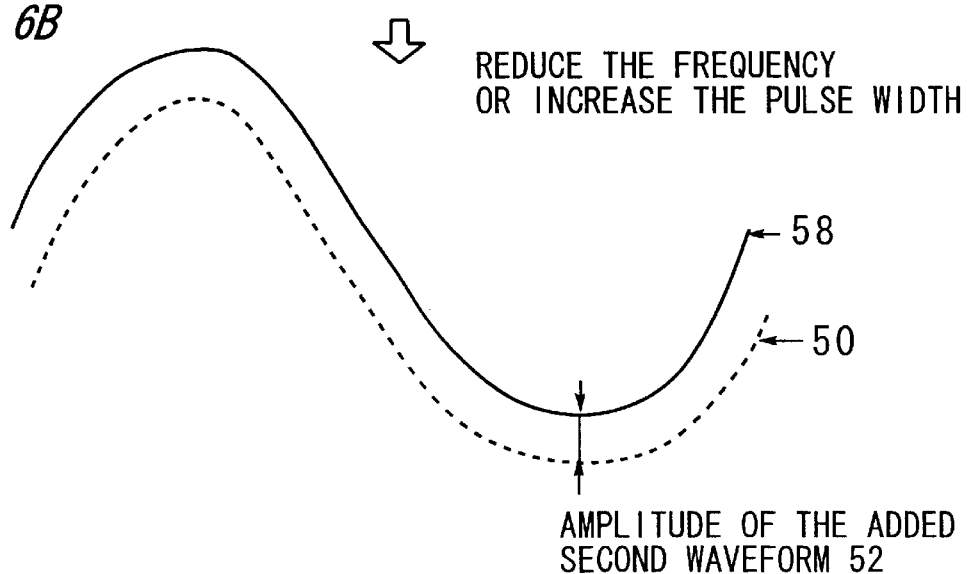

FIG. 6A and FIG. 6B are timing charts when the A-D converting device under test is defective in the semiconductor testing apparatus described with reference to FIG. 2. FIG. 6A shows relationship between the output value 58 and the first waveform 50 when the frequency of the sampling clock is high. In the case of the defective A-D converting device, the potential difference between the output value 58 and the first waveform 50 is less than the amplitude of the second waveform 52. For example, in the case of a normal A-D converting device, the potential difference between the output value 58 and the first waveform 50 is almost equal to the amplitude of the second waveform 52.

FIG. 6B shows relationship between the output value 58 and the first waveform 50 when tested at a frequency lower than that of the sampling clock shown in FIG. 6A. The potential difference between the output value 58 and the first waveform 50 is almost equal to the amplitude of the second waveform 52.

The comparator 16 judges that the A-D converting device operates normally in the event that the potential difference between the output value 58 and the first waveform 50 lies within a range by which the A-D converting device is judged to operate normally. For example, the comparator 16 judges that the A-D converting device 90 under test operates normally in the event that the potential difference between the output value 58 and the first waveform 50 lies within a range by which to be judged as normally operating in an allowable sampling clock frequency by which to judge that the A-D converting device 90 under test operates normally.

Figure 7A:
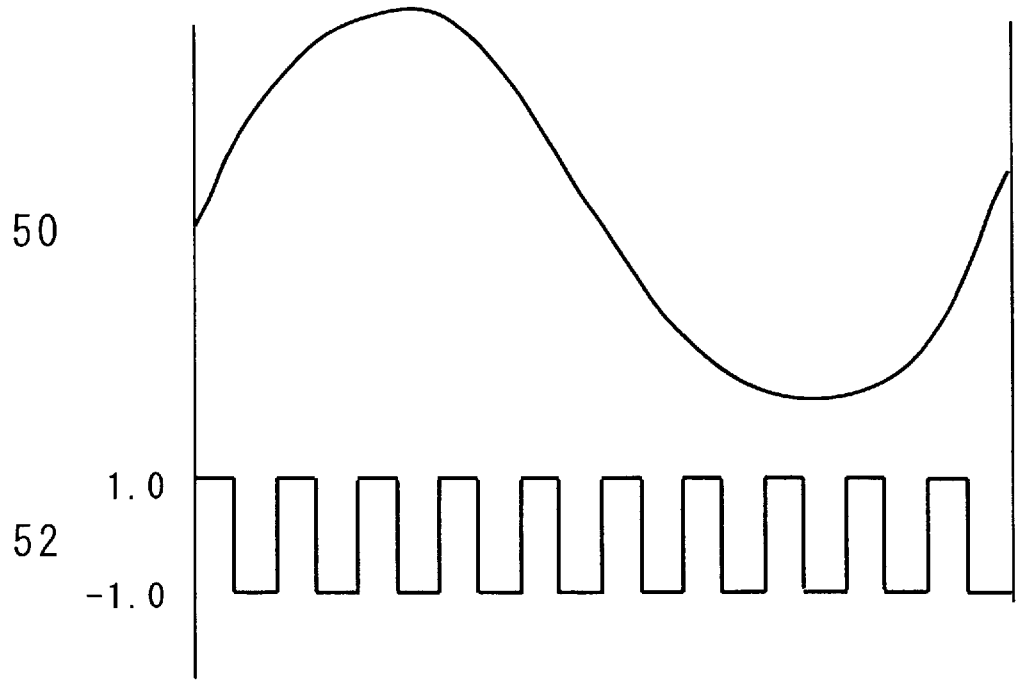
FIG. 7A and FIG. 7B show a first timing chart when a mulitplier is used as the waveform synthesis unit 28 in the semiconductor testing apparatus described with reference to FIG. 2.
Figure 7B:
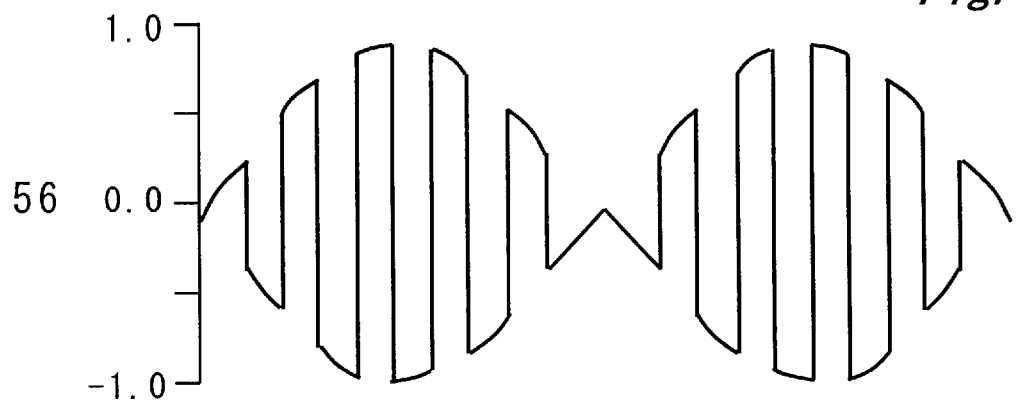

FIG. 7A and FIG. 7B show a first timing chart when a mulitplier is used as the waveform synthesizing unit 28 in the semiconductor testing apparatus described with reference to FIG. 2. This first timing chart shows an example where the first waveform generating unit 20 outputs the sinusoidal waveform as the first waveform 50, the second waveform generating unit 22 outputs the square wave of ±1.0 V as the second waveform, and the waveform synthesizing unit 28 multiplies the first waveform 50 to the second waveform 52 so as to produce the synthesized waveform 56.

Figure 8A:
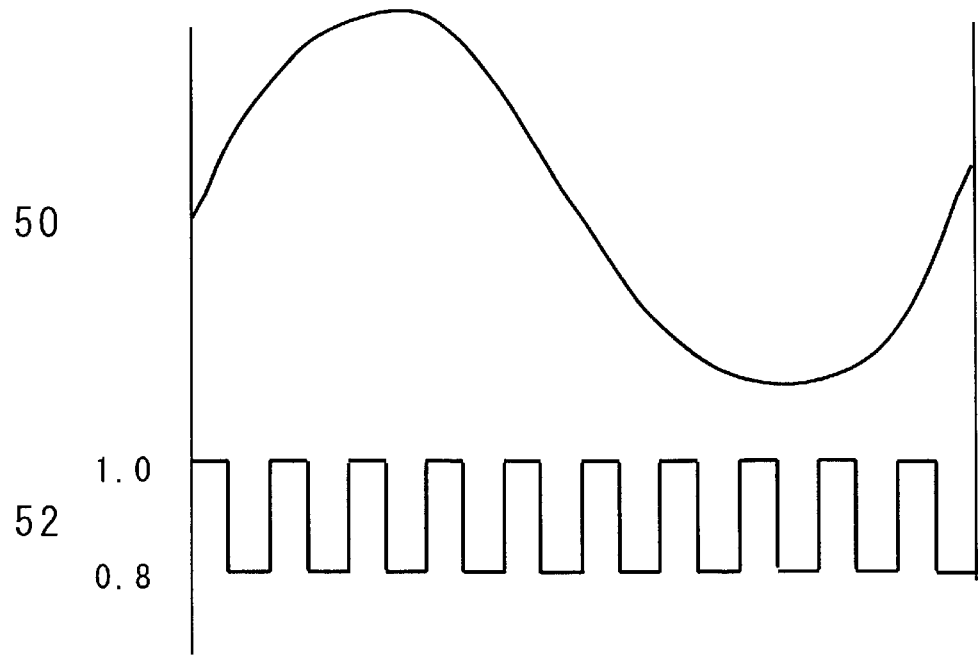
FIG. 8A and FIG. 8B show a second timing chart when a mulitplier is used as the waveform synthesis unit 28 in the semiconductor testing apparatus described with reference to FIG. 2.
Figure 8B:
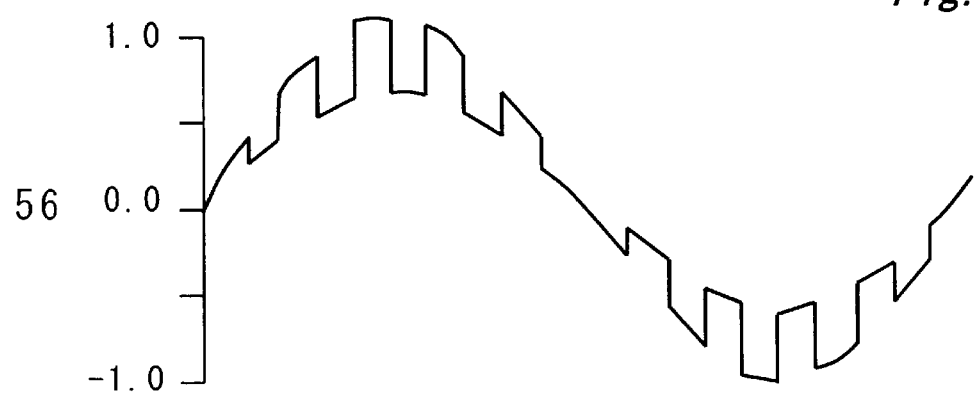

FIG. 8A and FIG. 8B show a second timing chart when a mulitplier is used as the waveform synthesizing unit 28 in the semiconductor testing apparatus described with reference to FIG. 2. This second timing chart shows an example where the first waveform generating unit 20 outputs the sinusoidal waveform as the first waveform 50, the second waveform generating unit 22 outputs the square wave of 0.8 V through 1.0 V as the second waveform, and the waveform synthesizing unit 28 multiplies the first waveform 50 to the second waveform 52 so as to produce the synthesized waveform 56.

Figure 9A:
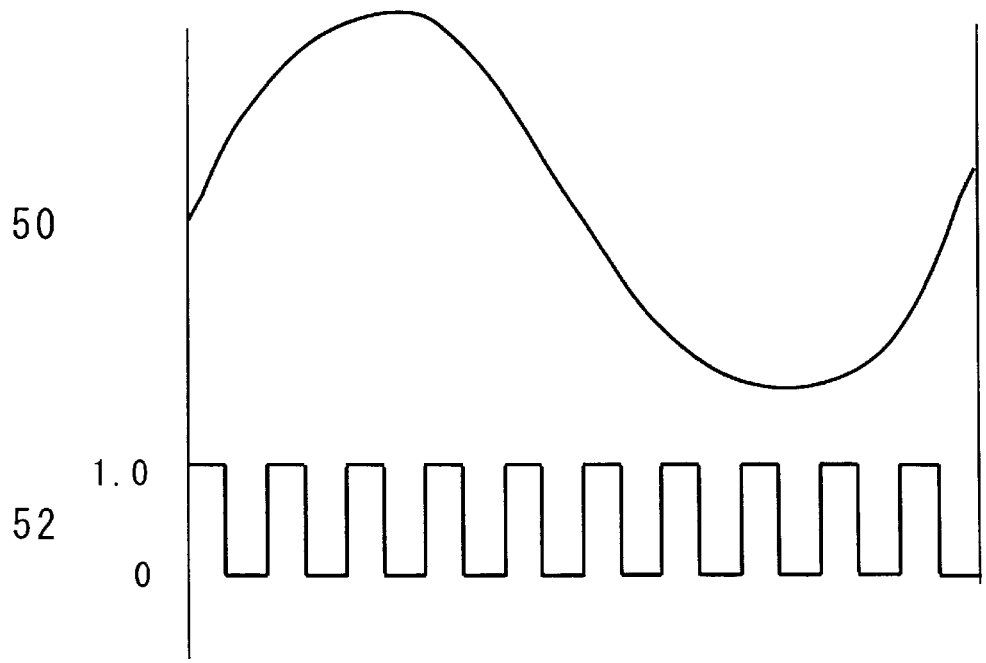
FIG. 9A and FIG. 9B show a third timing chart when a mulitplier is used as the waveform synthesis unit 28 in the semiconductor testing apparatus described with reference to FIG. 2.
Figure 9B:
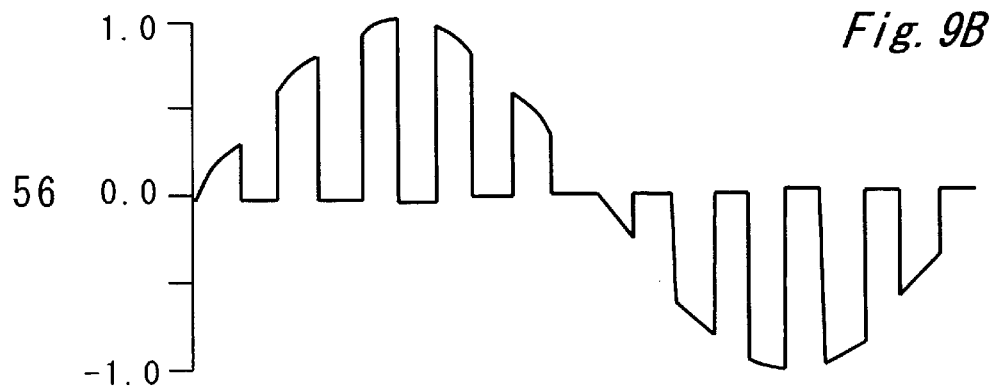

FIG. 9A and FIG. 9B show a third timing chart when a mulitplier is used as the waveform synthesis unit 28 in the semiconductor testing apparatus described with reference to FIG. 2. This second timing chart shows an example where the first waveform generating unit 20 outputs the sinusoidal waveform as the first waveform 50, the second waveform generating unit 22 outputs the square wave of 0 V through 1.0 V as the second waveform, and the waveform synthesizing unit 28 multiplies the first waveform 50 to the second waveform 52 so as to produce the synthesized waveform 56.

The semiconductor testing apparatus 100 can produce a variety and plurality of synthesized waveforms 56 by combination of the first waveform 50 and the second waveform 52, besides the synthesized waveform 56 described in FIGS. 7A, 7B, 8A, 8B, 9A and 9B. The synthesized waveform 56 is preferably set corresponding to the characteristic of the A-D converting device 90 under test. Moreover, according to still another embodiment, there may be provided a selector which can selectively choose a synthesis method of synthesizing the first waveform and the second waveform 52. According to still another embodiment, the waveform synthesizing (composite) unit 28 may output to the device contact portion 14 the synthesized (composite) waveform 56 by synthesizing a plurality of the second waveforms 52 supplied from a plurality of the second waveform generating units 22.

Figure 10:
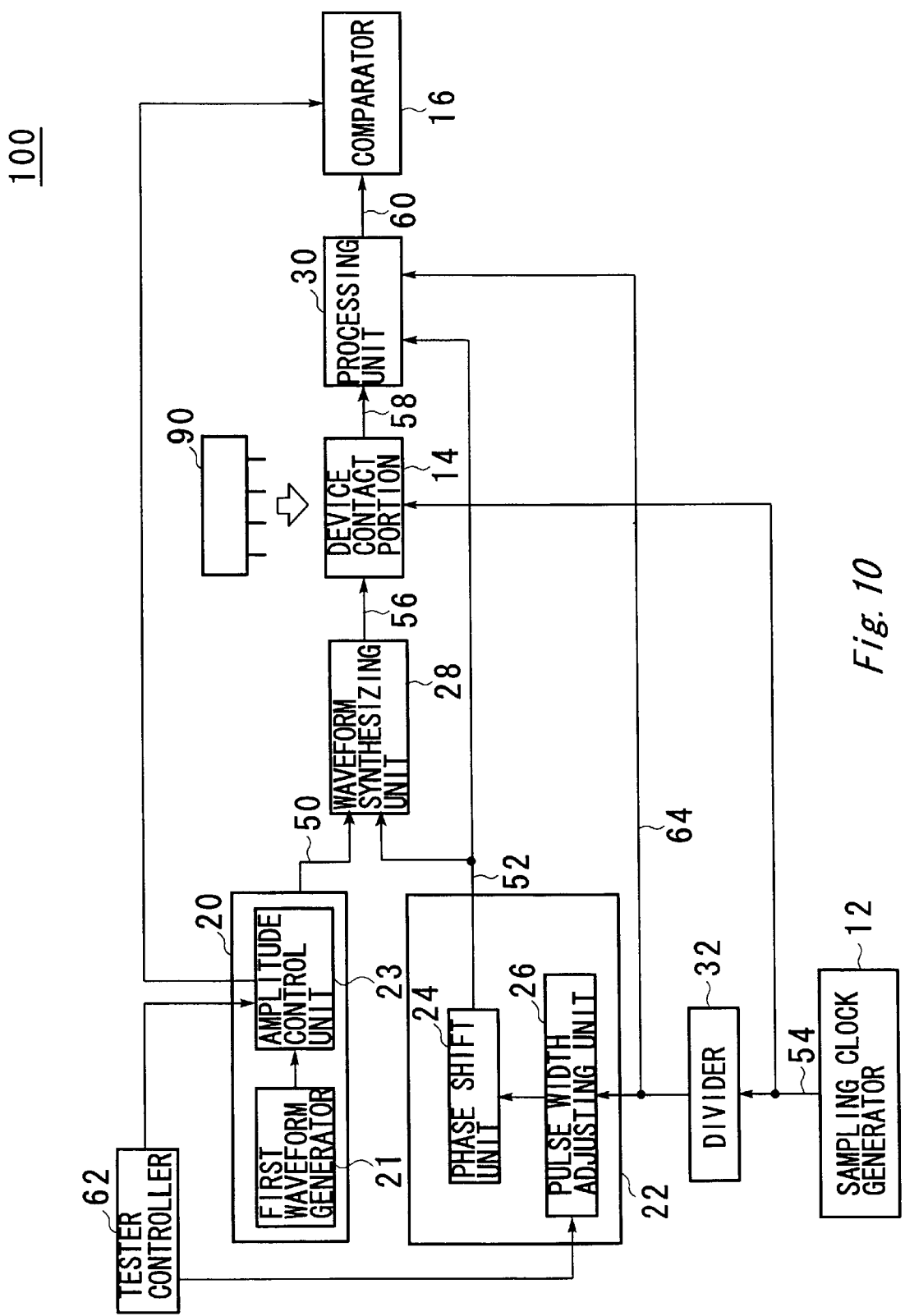
FIG. 10 is a block diagram showing another embodiment of the semiconductor testing apparatus described with reference to FIG. 2.

FIG. 10 is a block diagram showing another embodiment of the semiconductor testing apparatus described with reference to FIG. 2. This semiconductor testing apparatus 100 further comprises a frequency divider 32, in addition to the semiconductor testing apparatus 100 described with reference to FIG. 2. The same structures as found in FIG. 2 are given the same reference numerals for they have the same function, so that the description for the same structure will be omitted.

A frequency divider or a frequency demultiplier 32 divides the frequency of the sampling clock 54 so that a frequency-divided clock 64 is output to the second waveform generating unit 22. The frequency divider 32 outputs the frequency-divided clock 64 to the processing unit 30. For example, the frequency divider 32 may be a counter that counts the sampling clock 54.

The processing unit 30 extracts only the output value 58 supplied at the timing of the frequency-divided clock 64, from the output value 58 supplied through the device contact portion 14 at the timing of the sampling clock 54, so as to perform the process such that the effect of the second waveform 52 is removed from the output value 58.

Figure 11:
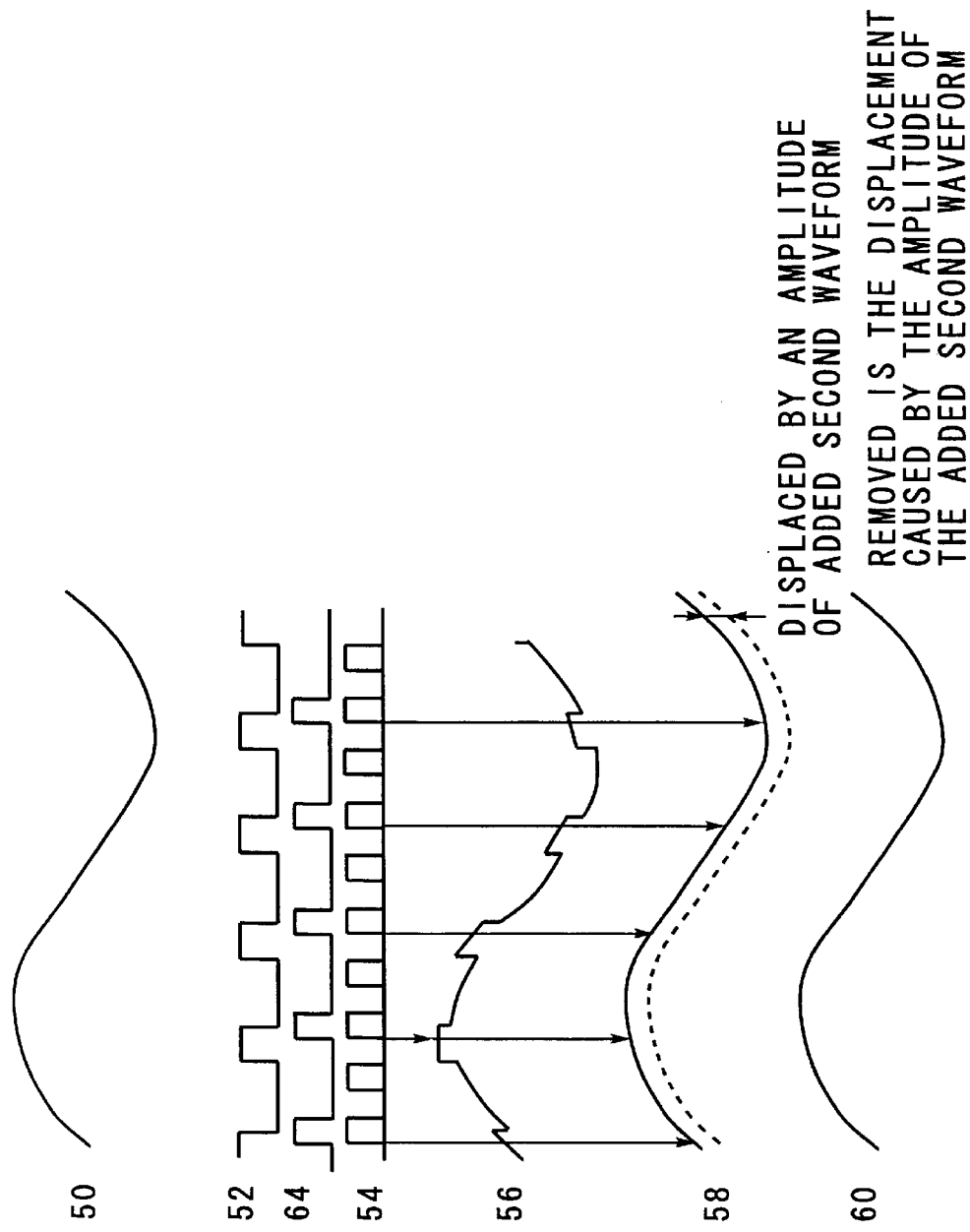
FIG. 11 shows a timing chart of the semiconductor testing apparatus described with reference to FIG. 10.

FIG. 11 shows a timing chart of the semiconductor testing apparatus described with reference to FIG. 10. This timing chart shows an example where the first waveform generating unit 20 outputs the sinusoidal waveform as the first waveform 50, the second waveform generating unit 22 outputs the square wave as the second waveform 52, the frequency divider 32 divides the frequency of the sampling clock 54 by 2, and the an adder serves as the waveform synthesizing unit 28.

The first waveform generating unit 20 outputs to the waveform synthesizing unit 28 the sinusoidal wave as the first waveform 50. The frequency divider 32 divides the frequency of the sampling clock 54 by 2, so that the frequency-divided clock 64 is output to the second waveform generating unit 22 and the processing unit 30. The second waveform generating unit 22 outputs to the waveform synthesizing unit 28 the square wave (as the second waveform 52) in which the phase of the frequency-divided clock 64 supplied from the frequency divider 32 is shifted by a predetermined amount. The waveform synthesizing unit 28 adds up the first waveform 50 and the second waveform 52 so as to output the thus synthesized waveform 56 to the device contact portion 14.

The A-D converting device 90 under test samples the synthesized waveform 56 at the timing of a rising edge of the sampling clock 54. Thus, the output value 58 becomes a value in which the amplitude of the second waveform 52 is added to that of the first waveform 50. The processing unit 30 outputs to the comparator 16 the output value 58 supplied at the timing of the sampling clock 54 and a processed signal 60 in which the amplitude of the second waveform 52 is subtracted from the output value 58 supplied at the timing of the frequency-divided clock 64. Thus, the processing unit performs the process such that the amplitude of the second waveform 52 is subtracted from the output value 58 utilizing part of the output value 58 where the amplitude of the square wave (the second waveform 52) is added to the first waveform 50.

Figure 12:
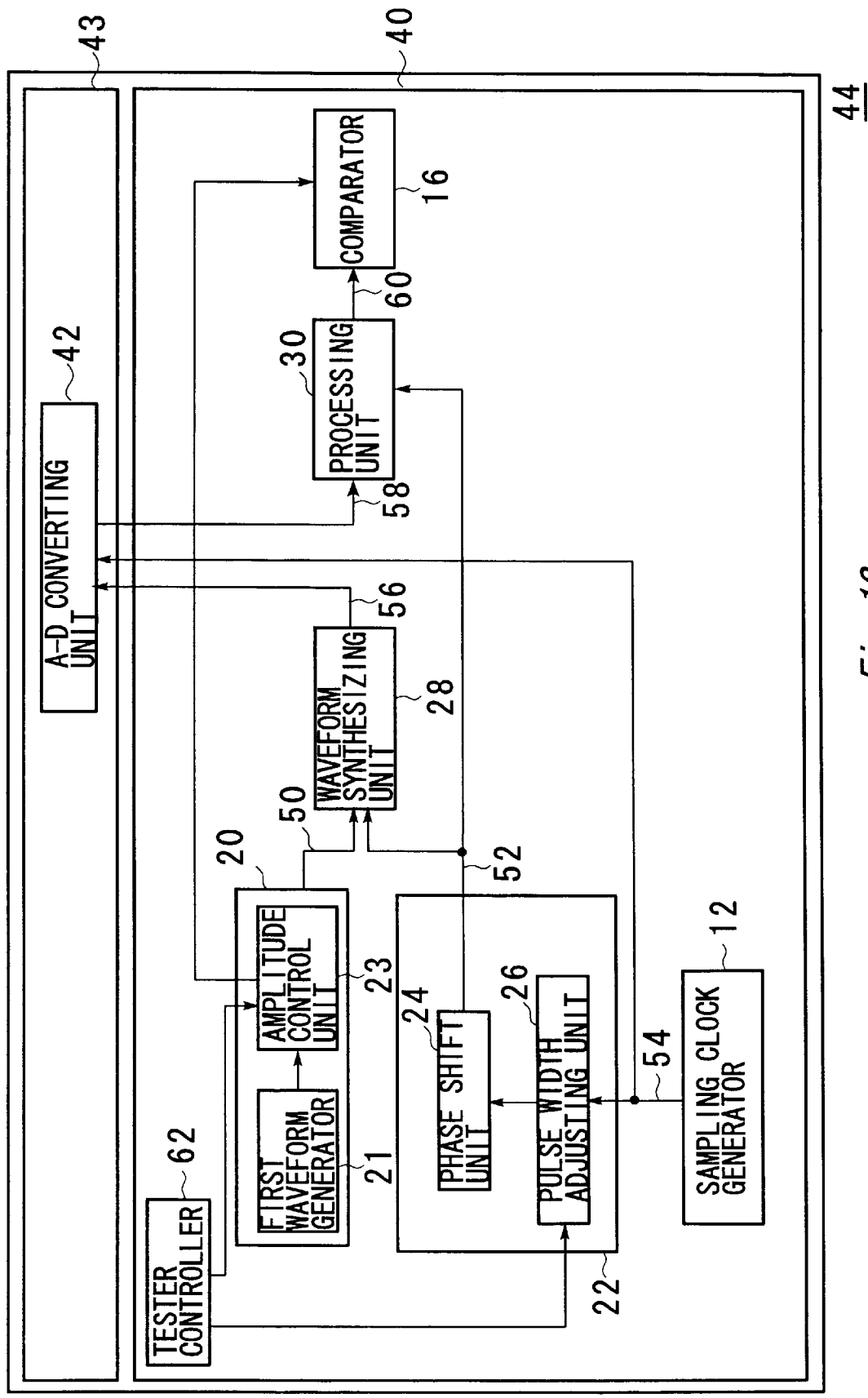
FIG. 12 is a block diagram showing a semiconductor device 44 which comprises a semiconductor testing unit 40 that tests an A-D converting unit which converts an analog signal to a digital signal.

FIG. 12 is a block diagram showing a semiconductor device 44 which comprises a semiconductor testing unit 40 that test an A-D converting unit which converts an analog signal to a digital signal. The semiconductor device 44 comprises a device portion 43 and a semiconductor testing unit 40. The device portion 43 includes an A-D converting unit 42 therein. The semiconductor testing unit 40 comprises: a first waveform generating unit 20; a second waveform generating unit 22; a waveform synthesizing unit 28; a processing unit 30; a comparator 16; a sampling clock generator 12; and a tester controller 62. The first waveform generating unit 20 includes a first waveform generator 21 and an amplitude control unit 23. The second waveform generating unit 22 includes a pulse width adjusting unit 26 and a phase shift unit 24.

The first waveform generator 21 generates a test waveform which is to be input to the A-D converting unit 42 so as to be output to the amplitude control unit 23. For example, the first waveform generator 21 may generate a sinusoidal waveform as the test waveform. The amplitude control unit 23 controls an amplitude of the test waveform (which corresponds to the characteristic of the A-D converting unit 42) supplied from the first waveform generator 21, based on an amplitude control signal supplied from the tester controller 62, so that a first waveform 50 is output to the waveform synthesizing unit 28.

For example, the amplitude control unit 23 may set an amplitude of the test waveform, based on an input rage within the range of a voltage level of the analog signal that the A-D converting unit 42 can convert into the digital signal. For example, when the input range of the A-D converting unit 42 is within ±1.0 V, the amplitude control unit 23 sets the amplitude of the test waveform at ±1.0 V. Moreover, the amplitude control unit 23 outputs to the comparator 16 an expectation value that is the first waveform 50. According to another embodiment, the first waveform generating unit 20 includes an A-D converting device and may output the digitized first waveform 50 to the comparator as the expectation value. According to still another embodiment, the first waveform generating unit 20 may be provided external to the semiconductor device 44.

The sampling clock generator 12 outputs to the pulse width adjusting unit 26 and the A-D converting unit 42 a sampling clock 54 which sets a sampling interval. The pulse width adjusting unit 26 included in the second waveform generating unit 22 adjusts the pulse width of the sampling clock 54, based on the pulse width adjusting signal supplied from the tester controller 62. The pulse width adjusting unit 26 outputs to the phase shift unit 24 the pulse width adjusted sampling clock 54.

For example, when a pulse width adjusting signal which specifies the pulse width to widen is supplied, the pulse width adjusting unit 26 widens the pulse width of the sampling clock 54. When a pulse width adjusting signal which specifies the pulse width to narrow is supplied, the pulse width adjusting unit 26 narrows the pulse width of the sampling clock 54. Moreover, when a pulse width adjusting signal which specifies the pulse width not to change, the pulse width adjusting unit 26 does not change the pulse width of the sampling clock 54. According to still another embodiment, a PLL (phase locked loop) which generates a clock having a predetermined period may serve as the second waveform generating unit 22. Moreover, the second waveform generating unit 22 may further include a frequency divider which divides the frequency of the sampling clock 54, and may produce the second waveform 52 based on the frequency-divided sampling clock 54.

The phase shift unit 24 shifts a phase of the sampling clock 54 supplied from the pulse width adjusting unit 26, by a predetermined amount, so as to output the second waveform 52 to the waveform synthesizing unit 28 and the processing unit 30. The waveform synthesizing unit 28 synthesizes the first waveform 50 and the second waveform 52 so as to output a synthesized (composite) waveform to the A-D converting unit 42. For example, the waveform synthesizing unit 28 maybe an adder which adds up the first waveform 50 and the second waveform 52. According to still another embodiment, the waveform synthesizing unit 28 may be a multiplier which multiplies the first waveform 50 to the second waveform 52. According to still another embodiment, the waveform synthesizing unit 28 may be a subtracter which subtracts the second waveform 52 from the first waveform 50. As a still another embodiment, the semiconductor device 44 may comprise a plurality of the second waveform generating units 22, so that the waveform synthesizing unit 28 synthesizes a plurality of the second waveforms 52 supplied from a plurality of the second waveform generating units 22 so as to output the synthesized waveform 56 to the device contact portion 14.

The A-D converting unit 42 samples the synthesized waveform 56 at the timing of the sampling clock 54 supplied from the sampling clock generator 12. The A-D converting unit 42 outputs to the processing unit 30 the sampled value obtained by sampling the synthesized waveform 56.

The processing unit 30 performs a process by which to remove the effect of the second waveform 52 from the output value 58, so as to output the processed signal 60 to the comparator 16. For example, the processing unit 30 may perform a filtering process which removes a particular frequency from the output value 58, and the processing unit 30 may perform a filtering process which removes a frequency of the second waveform 52 from the output value 58. The comparator 16 compares the processed signal 60 with the expectation value that is the first waveform supplied from the first waveform generating unit 20, so as to judge whether or not the A-D converting unit 42 is defective, that is whether or not the unit 42 operates normally. For example, the comparator 16 may compare or specifically detect the displacement between the processed signal 60 and the expectation value, so that whether or not the A-D converting unit 42 operates normally is judged based on whether or not the displacement lies within a predetermined range. For example, in a case of a high-precision A-D converting unit 42, the predetermined range is set to approximately 0. Moreover, the predetermined range is preferably set according to the A-D converting unit 42.

Moreover, when the device portion 43 is comprised of a structure by which to perform a predetermined process on an input signal of an amplifier or the like, besides the A-D converting device 42 which converts the analog signal to the digital signal, the comparator 16 judges whether or not the A-D converting unit 42 operates normally, by preferably taking into consideration the effect due to the structure that perform the predetermined process.

In the above specification, it is to be noted that the square wave may be replaced with a rectangular wave.

Accordingly, by implementing the present invention there is provided significantly efficient and extremely cost-effective semiconductor testing apparatus that tests the A-D converting device.

Although the present invention has been described by way of exemplary embodiments, it should be understood that many changes and substitutions may be made by those skilled in the art without departing from the spirit and the scope of the present invention which is defined only by the appended claims.

What is claimed is:

1. Semiconductor testing apparatus for testing a semiconductor device having an A-D converting unit that converts an analog signal to a digital signal, the apparatus comprising:

a first waveform generating unit which generates a first waveform having a predetermined waveform component;

a second waveform generating unit which generates a second waveform having a known waveform component, wherein said second waveform generating unit generates the second waveform based on a sampling clock which sets a sampling interval of the A-D converting unit;

a waveform synthesizing unit which generates a composite waveform by synthesizing the first waveform and the second waveform;

a processing unit which processes to remove an effect of the second waveform from an output value of the semiconductor device to which the composite waveform is input; and a comparator which judges whether or not the semiconductor device operates normally, based on the first waveform and the output value processed by said processing unit.

2. Semiconductor testing apparatus of claim 1, wherein said comparator judges whether or not the semiconductor device operates normally based on whether or not difference between the first waveform and the output value processed by said processing unit is within a predetermined range.

3. Semiconductor testing apparatus of claim 1, wherein said second waveform generating unit generates the second waveform by frequency-dividing the sampling clock.

4. Semiconductor testing apparatus of claim 1, further comprising a phase shift unit that shifts a phase of the second waveform by a predetermined amount.

5. Semiconductor testing apparatus of claim 1, further comprising a pulse width adjusting unit that changes a pulse width of the second waveform, wherein the second waveform is of a square wave.

6. Semiconductor testing apparatus of claim 1, the first waveform being of a sinusoidal wave, further comprising an amplitude control unit which sets amplitude of the sinusoidal wave.

7. Semiconductor testing apparatus of claim 1, wherein said processing unit reduces the effect of the second waveform by performing a filtering process on the output value.

8. Semiconductor testing apparatus of claim 1, further comprising a plurality of said second waveform generating units, wherein said waveform synthesizing unit generates the composite waveform by synthesizing the first waveform and a plurality of the second waveforms generated by a plurality of said second waveform generating units.

9. The semiconductor device testing apparatus according to claim 1, further comprising a divider generating a clock signal substantially matching with input frequency of the A-D converter unit according to a timing of said sampling clock.

10. A method of testing a semiconductor device having an A-D converting unit that converts an analog to a digital signal, the method comprising:

generating a synthesized waveform by a first waveform having a predetermined waveform component and a second waveform whose waveform component is known, wherein said second waveform being generated based on a sampling clock which sets a sampling interval of the A-D converter unit;

inputting the synthesized waveform to the semiconductor device;

removing an effect of the second waveform from an output value of the semiconductor device; and judging whether or not the semiconductor device operates normally, based on the first waveform and the output value in which the effect of the second waveform is removed.

11. A method of claim 10, wherein said judging judges whether or not the semiconductor device operates normally based on whether or not difference between the first waveform and the output value in which the effect of the second waveform is removed is within a predetermined.

12. The method according to claim 10, further comprising a step of generating a clock signal substantially matching with input frequency of the A-D converter unit according to a timing of said sampling clock.

13. A semiconductor device having a semiconductor testing unit which tests a device portion including an A-D converting unit that converts an analog signal to a digital signal, the device comprising:

a waveform synthesizing unit which synthesizes a first waveform having a predetermined waveform component and a second waveform whose waveform component is known, so as to generate a synthesized waveform, wherein the second waveform is generated based on a sampling clock which sets a sampling interval of the A-D converting unit;

the semiconductor device testing unit which tests the device portion, based on an output value of the device portion to which the synthesizes waveform is input; and the device portion which is tested by the semiconductor testing unit.

14. A semiconductor device of claim 13, wherein said semiconductor testing unit further comprises a first waveform generating unit which generates the first waveform.

15. A semiconductor device of claim 13, wherein said semiconductor testing unit further comprises:

a processing unit which processes to remove an effect of the second waveform from the output value of the device portion to which the synthesized waveform is input; and a comparator which judges whether or not the device portion operates normally, based on the first waveform and the output value processed by said processing unit.

16. A semiconductor device of claim 15, wherein said processing unit reduces the effect of the second waveform by performing a filtering process on the output value.

17. A semiconductor device of claim 13, wherein the second waveform is obtained by frequency-dividing the sampling clock.

18. A semiconductor device of claim 13, further comprising a phase shift unit which shifts a phase of the second waveform by a predetermined amount.

19. A semiconductor device of claim 13, further comprising a pulse width adjusting unit that changes a pulse width of the second waveform, wherein the second waveform is of a square wave.

20. A semiconductor device of claim 13, the first waveform being of a sinusoidal wave, further comprising an amplitude control unit which sets amplitude of the sinusoidal wave.

21. The semiconductor device according to claim 13, further comprising a divider generating a clock signal substantially matching with input frequency of the A-D converter unit according to a timing of said sampling clock.

* * * * *